United States Patent
Misewich et al.

(10) Patent No.: US 6,479,847 B2
(45) Date of Patent: *Nov. 12, 2002

(54) METHOD FOR COMPLEMENTARY OXIDE TRANSISTOR FABRICATION

(75) Inventors: James A. Misewich, Peakskill, NY (US); Alejandro G. Schrott, New York, NY (US); Bruce A. Scott, Pleasantville, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/306,509

(22) Filed: May 7, 1999

(65) Prior Publication Data

US 2002/0016030 A1 Feb. 7, 2002

(51) Int. Cl.[7] .......................... H01L 29/75; H01L 29/94; H01L 29/76; H01L 21/00
(52) U.S. Cl. ............................. 257/295; 257/410; 438/3
(58) Field of Search .......................... 257/295, 36–39, 257/410, 438

(56) References Cited

U.S. PATENT DOCUMENTS

| 5,155,658 A | * | 10/1992 | Inam et al. | 361/321 |
| 5,418,389 A | * | 5/1995 | Watanabe | 257/295 |
| 5,742,082 A | * | 4/1998 | Tehrani et al. | 257/280 |

OTHER PUBLICATIONS

Wolf vol. 2, 1986 edn. pp. 368–387.*

* cited by examiner

*Primary Examiner*—Olik Chaudhuri
*Assistant Examiner*—Shrinivas H. Rao
(74) *Attorney, Agent, or Firm*—McGinn & Gibb, PLLC; Marian Underweiser, Esq.

(57) ABSTRACT

A method of manufacturing an integrated circuit device includes forming a laminated structure having a first side and a second side, the first side includes a first type Mott channel layer and the second side includes a second type Mott channel layer. A first source region and a first drain region is formed on the first side, a second source region and a second drain region is formed on the second side, a first gate region is formed on the second side, opposite the first source region and the first drain region and a second gate region is formed on the first side, opposite the second source region and the second drain region. The first source, the first drain and the first gate comprise a first type field effect transistor and the second source, the second drain and the second gate comprise a second type field effect transistor.

35 Claims, 6 Drawing Sheets

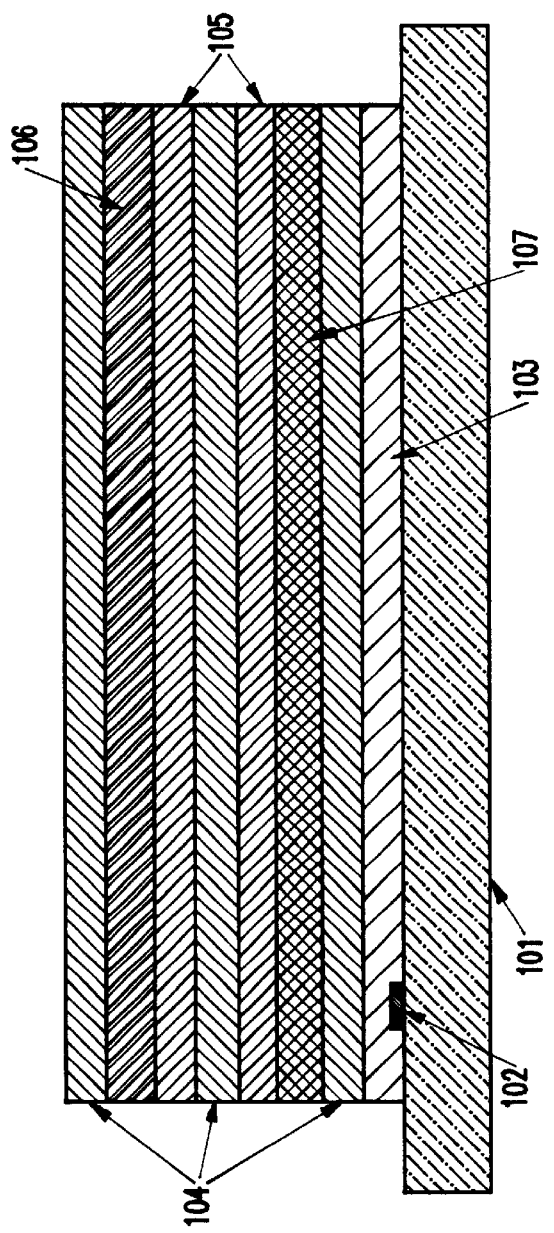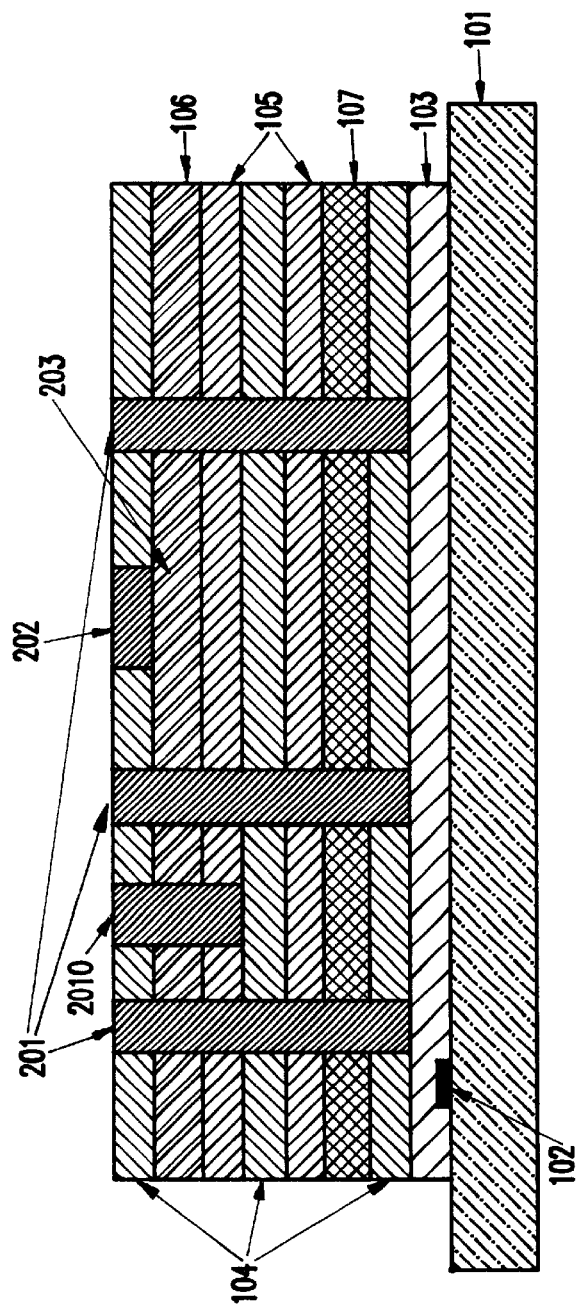

METHOD FOR COMPLEMENTARY OXIDE TRANSISTOR FABRICATION

BACKGROUND OF THE INVENTION

1. Field of the Invention

The present invention generally relates to integrated circuits and, more specifically to a complementary transistor structure having a Mott material oxide channels.

2. Description of the Related Art

Silicon based metal oxide semiconductor field effect transistors (MOSFETs) are reaching the limits of scaling (e.g., reduction in size) due to, among other things, doping and double depletion effects. In other words, as semiconductor devices are reduced in size, the depletion regions are placed in closer proximity to one another. This often results in merging or shorting of the adjacent depletion regions.

Silicon MOSFET technology is expected to scale to 0.1 micron channel length devices after the year 2000. Below 0.1 microns however, there are fundamental physical effects which can limit silicon MOSFET technology, including: short channel effects, dopant number fluctuations, ballistic transport and tunneling through thin gate oxides. These effects may limit the minimum channel length in silicon MOSFET technology to an estimated 30 nm.

One solution to the scaling problem is a field effect transistor (FET) formed with a channel oxide capable of undergoing a metal-insulator transition known as a Mott transition (e.g., a Mott FET or MTFET).

A Mott FET is a solid state switching device made of oxide materials and is discussed in more detailed in Mott Transition Field Effect Transistor, Applied Physics Letters, Vol 73, Number 6, pages 780–782, Aug. 10, 1998, incorporated herein by reference. The Mott FET device includes a channel connecting source and drain electrodes, a gate oxide and a gate electrode.

For example, a Mott FET device is shown in FIG. 13. The device includes a conductive substrate 1301 (e.g., Nb-STO (100)-cut crystal) which forms the gate electrode, a gate oxide layer 1300 (e.g., strontium titanate (STO)) epitaxially grown on the substrate 1301, a Mott conductor-insulator transition channel 1302 (e.g., epitaxially grown cuprate material such as $Y_{1-x}Pr_xBa_2CU_3O_{7-\delta}$(YPBCO, LCO)), source and drain electrodes 1303 and an isolation trench 1304. With the structure shown in FIG. 13, when an electric field is applied to the gate 1300, the channel 1302 changes from an insulator to a conductor (or vice versa) to make or break a connection between the source and drain 1303.

The Mott FET device is quite distinct from conventional silicon metal oxide field effect transistors in that the channel is a Mott insulator, a material with a characteristic, controllable, conductor-insulator transition, used in place of a semiconductor. A Mott FET device offers significant potential for scaling to the nanometer dimensions for integration with ferroelectric materials in non-volatile storage roles and for fabrication of multilayer device structures. Mott FET devices remain adequate on a nanoscopic scale which is well beyond the current projected limits of silicon MOSFET scaling.

However, the Mott FET discussed above has a number of limitations. Specifically, the structure shown in FIG. 13 results in the channel layer 1302 being exposed to subsequent processing steps, which may damage or undesirably change the channel layer 1302. Also, conventional Mott-FET devices suffer from the shortcoming that the channel layer is not protected. Further, they have a common gate electrode which does not allow the formation of a complementary cell.

SUMMARY OF THE INVENTION

It is, therefore, an object of the present invention to provide a structure and method for manufacturing a complementary field effect transistor structure that includes forming a first type Mott channel layer and forming a second type Mott channel layer adjacent the first type Mott channel layer, wherein the first type Mott channel layer is complementary to the second type Mott channel layer.

The method may also include forming a first source region, a first drain region and a first gate conductor region adjacent the first type Mott channel layer and forming a second source region, a second drain region and a second gate conductor region adjacent the second type Mott channel layer. The first source region, the first drain region, the first gate conductor region and the first Mott channel layer are a first type field effect transistor and the second source region, the second drain region, the second gate conductor region and the second type Mott channel layer are a second type field effect transistor electrically connected to the first type field effect transistor.

The forming of the first source region and the first drain region includes forming a first conductive layer adjacent the first type Mott channel layer and forming a first insulator region in the first conductive layer opposite the first gate conductor. The first source region and the first drain region are regions in the first conductive layer on opposite sides of the first insulator region.

Similarly, the forming of the second source region and the second drain region includes forming a second conductive layer adjacent the second type Mott channel layer and forming a second insulator region in the second conductive layer opposite the second gate conductor. The second source region and the second drain region are regions in the second conductive layer on opposite sides of the second insulator region.

Also, the forming of the first gate conductor region and the forming of the second gate conductor region include forming a gate conductor layer insulated from and positioned between the first type Mott channel layer and the second type Mott channel layer (the first conductive layer and the second conductive layer respectively being on opposite sides of the first type Mott channel layer and the second type Mott channel layer from the gate conductor layer) and forming a plurality of insulator regions in the gate conductor layer. The first gate conductor region is a region of the gate conductor layer between two of the insulator regions and is positioned opposite and between the first source region and the first drain region. Similarly, the second gate conductor region is a region of the gate conductor layer between two of the insulator regions and is positioned opposite and between the second source region and the second drain region.

The method may also include forming a first conductive oxide layer as the first conductive layer, forming the first type Mott transition layer on the first conductive oxide layer, forming a first gate insulator layer on the first type Mott channel layer, forming a second conductive oxide layer as the gate conductor layer on the first gate insulator layer, forming a second gate insulator layer on the second conductive oxide layer, forming the second type Mott channel layer on the second gate insulator layer and forming a third conductive oxide layer as the second conductive layer on the second type Mott channel layer.

The first type Mott channel layer and the second type Mott channel layer change conductivity in the presence of an electric field. The first type field effect transistor and the second type field effect transistor can be connected to form a complementary field effect transistor.

Another inventive method of manufacturing a complementary field effect transistor structure includes forming a laminated structure having a first side and a second side (the first side including a first type Mott channel layer and the second side including a second type Mott channel layer), forming a first source region and a first drain region in a first conductive layer on the first side, forming a second source region and a second drain region in a second conductive layer on the second side and forming a first gate conductor region and a second gate conductor region in a gate conductor layer positioned between and insulated from the first type Mott channel layer and the second type Mott channel layer. The first source region, the first drain region, the first gate conductor region and the first type Mott channel layer make a first type field effect transistor and the second source region, the second drain region, the second gate conductor region and the second type Mott channel layer make a second type field effect transistor.

Another embodiment of the invention is a method of manufacturing a complementary field effect transistor structure that includes forming a first type Mott channel layer over a first portion of a substrate and forming a second type Mott channel layer over a second portion of the substrate. The first type Mott channel layer is complementary to the second type Mott channel layer.

Further, the invention includes a method of manufacturing a complementary field effect transistor that includes forming a release layer on a substrate, removing a first portion of the release layer to expose a first portion of the substrate and to allow a second portion of the release layer to remain, forming a first portion of a first type Mott channel layer over the first portion of the substrate and a second portion of the first type Mott channel layer over the second portion of the release layer, forming a first portion of a first insulator layer over the first portion of the first type Mott channel layer and a second portion of the first insulator layer over the second portion of the first type Mott channel layer, removing the second portion of the release layer to, release the second portion of the Mott channel layer and the second portion of the first insulator layer and to expose the second portion of the substrate, forming a first portion of a second type Mott channel layer over the first portion of the first insulator layer and forming a second portion of the second type Mott channel layer over the second portion of the substrate, forming a first portion of a second insulator layer over the first portion of the second type Mott channel layer and a second portion of the second insulator layer over the second portion of the second type Mott channel layer and removing the first portion of the second insulator and the first portion of the second type Mott channel layer.

Before the second portion of the release layer is removed a via is formed between: the first portion of the first insulator and the first portion of the first type Mott channel layer; and the second portion of the first insulator, the second portion of the first type Mott channel layer and the second portion of the release layer. The removing of the first portion of the second insulator and the first portion of the second type Mott channel layer includes one of, dry lithographic patterned etching, wet lithographic patterned etching and chemical mechanical polishing.

The complementary field effect structure according to the invention includes a first type Mott channel layer and a second type Mott channel layer adjacent the first type Mott channel layer. The first type Mott channel layer is complementary to the second type Mott channel layer.

The structure also includes a first source region, a first drain region and a first gate conductor region adjacent the first type Mott channel layer and a second source region, a second drain region and a second gate conductor region adjacent the second type Mott channel layer. The first source region, the first drain region, the first gate conductor region and the first Mott channel layer make a first type field effect transistor. The second source region, the second drain region, the second gate conductor region and the second type Mott channel layer make a second type field effect transistor electrically connected to the first type field effect transistor.

The first source region and the first drain region may include a first conductive layer adjacent the first type Mott channel layer and a first insulator region in the first conductive layer opposite the first gate conductor. The first source region and the first drain region being regions in the first conductive layer on opposite sides of the first insulator region.

Similarly, the second source region and the second drain region may include a second conductive layer adjacent the second type Mott channel layer and a second insulator region in the second conductive layer opposite the second gate conductor. The second source region and the second drain region are regions in the second conductive layer on opposite sides of the second insulator region.

Also, the first gate conductor region and the second gate conductor region may include a gate conductor layer insulated from and positioned between the first type Mott channel layer and the second type Mott channel layer (the first conductive layer and the second conductive layer respectively being on opposite sides of the first type Mott channel layer and the second type Mott channel layer from the gate conductor layer) and a plurality of insulator regions in the gate conductor layer. The first gate conductor region being a region of the gate conductor layer between two of the insulator regions and positioned opposite and between the first source region and the first drain region. The second gate conductor region being a region of the gate conductor layer between two of the insulator regions and positioned opposite and between the second source region and the second drain region.

The first conductive layer, the second conductive layer and the gate conductor layer are conductive oxide layers, and the first type Mott transition layer is positioned on the first conductive layer. The structure also includes a first gate insulator layer positioned on the first type Mott channel layer (the gate conductor layer being positioned on the first gate insulator layer) and a second gate insulator layer positioned on the gate conductor layer (the second type Mott channel layer being positioned on the second gate insulator layer and the second conductive layer being positioned on the second type Mott channel layer).

The first type Mott channel layer and the second type Mott channel layer change conductivity in the presence of an electric field. The first type field effect transistor and the second type field effect transistor can be connected to form a complementary field effect transistor.

Another embodiment of the invention is a complementary field effect transistor structure that includes a laminated structure having a first side and a second side (the first side including a first type Mott channel layer and the second side including a second type Mott channel layer), a first conductive layer on the first side having a first source region and a first drain region, a second conductive layer on the second side having a second source region and a second drain region and a gate conductor layer positioned between and insulated from the first type Mott channel layer and the second type Mott channel layer (the gate conductor layer having a first gate conductor region and a second gate conductor region). The first source region, the first drain region, the first gate conductor region and the first type Mott channel layer form a first type field effect transistor and the second source region, the second drain region, the second gate conductor region and the second type Mott channel layer form a second type field effect transistor.

A further embodiment of the invention is a complementary field effect transistor structure that includes a substrate having first and second portions, a first type Mott channel layer positioned over the first portion of the substrate and a second type Mott channel layer positioned over a second portion of the substrate. The first type Mott channel layer is complementary to the second type Mott channel layer.

The invention overcomes the problems associated with conventional semiconductor structures by utilizing the laminated structures shown in FIGS. 1 and 9 to create complementary metal oxide field effect transistor devices which do not include doped diffusion regions and which, therefore, can be made much smaller than conventional semiconductor devices.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a schematic diagram of a cross-sectional view of a partially completed transistor according to the invention;

FIG. 2 is a schematic diagram of a cross-sectional view of a partially completed transistor according to the invention;

DETAILED DESCRIPTION OF PREFERRED EMBODIMENTS OF THE INVENTION

Figure 3:
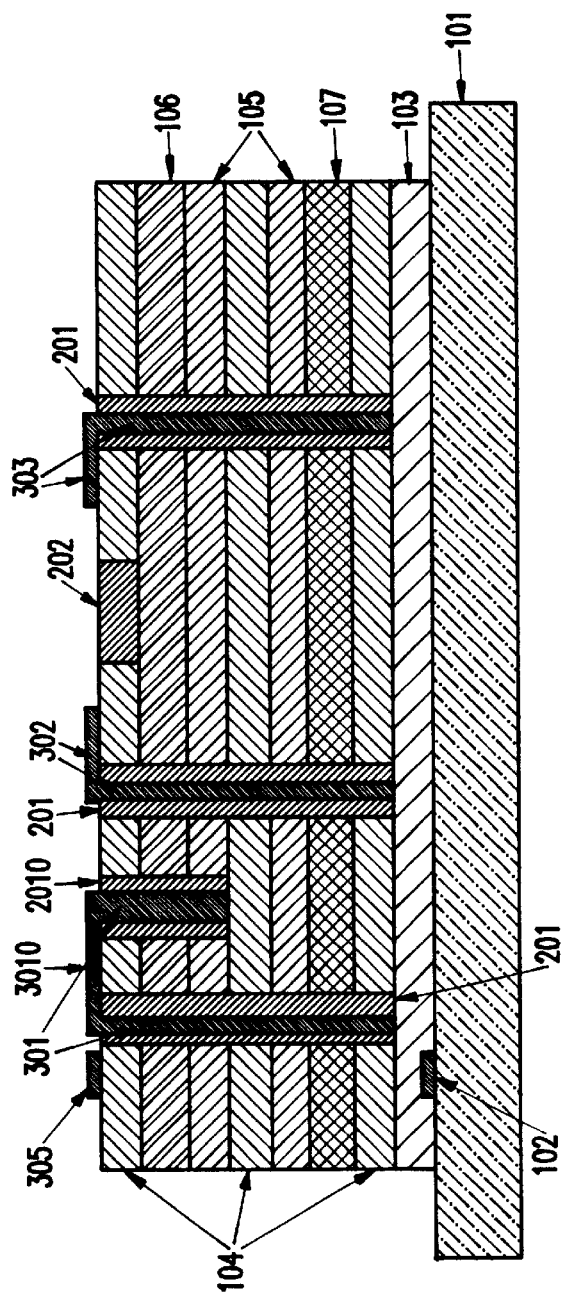
FIG. 3 is a schematic diagram of a cross-sectional view of a partially completed transistor according to the invention.

The invention overcomes the foregoing problem of fabricating a Mott-FET device and allows the use of state of the art lithographic techniques, while preserving ideal conditions for epitaxial growth.

Preserving ideal conditions for epitaxial growth of the Mott transition channel layer is important because atomic control is needed to fabricate current oxide-channel devices. In particular the channel layer is one element that requires the highest degree of long range order and the lowest density of imperfections. Desirable conditions for good epitaxial growth of the channel layer include a flat single-crystal'substrate with a good lattice match. The gate insulator, requires a lesser degree of lattice perfection and can be deposited after the channel layer. Therefore, the invention forms a buried Mott transition channel layer using a special process to provide for the channel definition and for the necessary contacts to buried source and drain regions.

More specifically, referring to FIG. 1, a thin non-reactive metallic material, such as Pt, etc. is deposited (either by evaporation, sputtering, or other well known deposition process) and patterned (e.g., using common patterning techniques, such as lithographic masking and etching) to form alignment marks 102 on a clean flat single crystal perovskite oxide substrate (e.g. Srontium titanate (STO)) 101, Lanthaum Aluminate) or Strontium Lanthaum Aluminate.

The following material layers are successively formed over the substrate using conventional methods (e.g., epitaxial methods) well known to those ordinarily skilled in the art (such as Pulsed Laser Deposition (LPD)): a release layer 103 (e.g.,10–50 nm of $YBa_2Cu_3O_7$ "YBCO", etc.); a conductive oxide 104 (e.g., strontium ruthanate); a N-type Mott transition channel layer 107 (e.g., $Nd_2CuO_4$) 107; a gate insulator 105 (e.g., an oxide of high dielectric constant, such as Strontium Titanate (STO), Barium Strontium Titanate (BSTO), etc); another conductive oxide layer 104; another high dielectric layer 105; a P-type Mott transition channel layer 106 (e.g., $La_2CuO_4$ (LCO)); and finally, yet another conductive oxide layer 104.

Referring now to FIG. 2, vias 201 are opened for source and drain electrodes using, for example, common masking and etching techniques well known to those ordinarily skilled in the art. Also, a via 2010 for the gate and the gap 202 (that will define the channel region 203 of the P-type channel Mott transition layer 106) are similarly formed. In a preferred embodiment, the vias 201, 203, 2010 are formed using at least a three step procedure, using different etch stops to reach the different levels shown in FIG. 2. The vias 201, 2010 and 202 in FIG. 2 are then filled with a low dielectric constant material such as tetraethylorthosilicate (TEOS), etc., using conventional techniques, such as sputtering, evaporation, chemical vapor deposition, etc.

In FIG. 3, new vias are opened in the previous low dielectric material 201, 2010 (again, using the processes described above) and filled with a conductor (e.g., metal, alloy, semiconductor, etc.), using conventional deposition techniques, such as those discussed above, to define a conductive path 301, 3010 for the gate electrode of the N-type device, the metallization for the drain 302 of the P-type device and the metallization 303 for the source of the P-type device.

Figure 4:
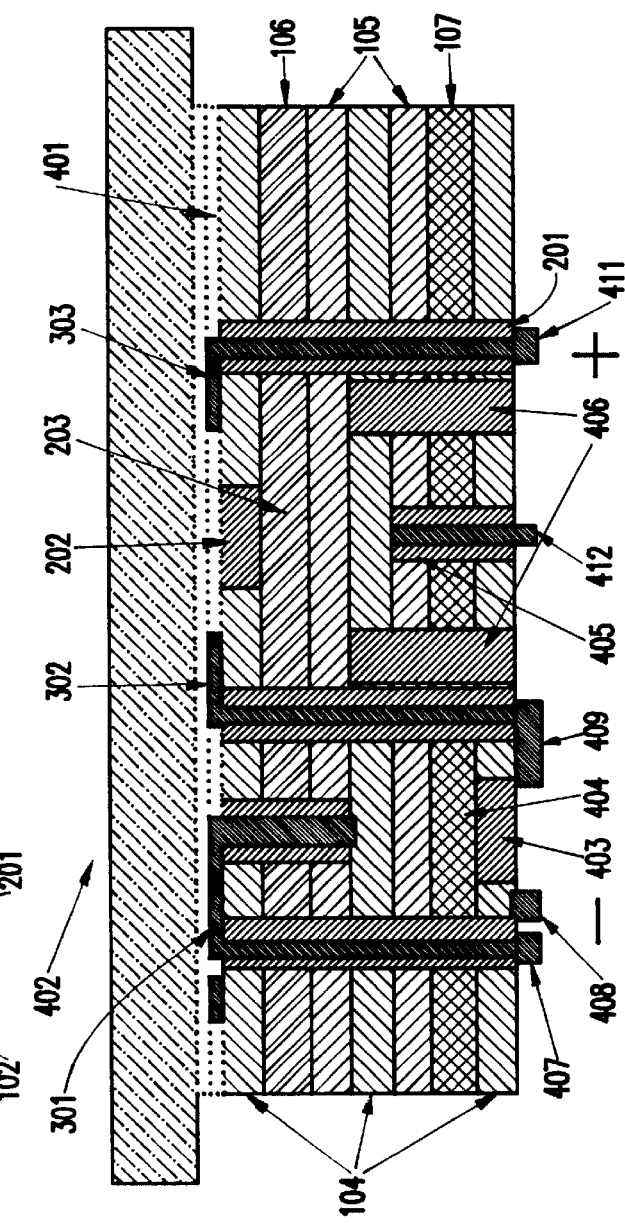
FIG. 4 is a schematic diagram of a cross-sectional view of a completed transistor according to the invention.

The structure shown in FIG. 4 is then formed using the following processes. A binder/filler 401 (e.g., benzo cyclo butene or a wax (Apiezone W)) is applied again using conventional techniques, such as physical deposition, and a "top" substrate 402 is joined to the structure and held in place by the binder/filler 401. The initial substrate 101 is released by removing the "release-layer" 103 by appropriate wet etching (e.g., a HCI or HF solution). This portion of the invention is ideal because the Strontium Ruthanate 104 is extremely resistant to HCI and HF and, therefore, the remaining structure is not affected by the removal of the release layer 103.

Then, a gap 403 is opened and filled with an insulator (again, using conventional masking, etching and deposition techniques, such as those discussed above) to define the N-channel region 404 of the N-channel Mott transition layer 107. Vias 405 are then opened and filled with an insulator (as discussed above) to define the gate width of the P-type device. Similarly, vias 406 are opened and filled with insulation to define the P-type device.

Using conventional methods, such as the deposition and patterning methods mentioned above, metal contacts 407 to the gate 301 and source 408 of the N-type device are formed. The contacts to the drain 411 and to the gate 412 of the P-type device are similarly formed. The device shown in FIG. 4 is, for example, an inverter. Therefore, in this example, the drain of the N-type device and the source of the P-type device are connected to a single contact 409, as shown in FIG. 4 and the two gates 301, 412 are tied together (not shown in the two-dimensional drawing).

In operation, application of voltage to either gate 301, 412 would cause the conductivity of the channel layer 106, 107 to change allowing (or preventing) and electrical connection to form between the source and drain regions 408, 409; 302, 303. As mentioned above, the example shown in FIG. 4 is an inverter. Therefore, the complementary field effect transistors shown in FIG. 4 (e.g., having a source and drain connected and the gates connected) would alter the polarity of (e.g., invert) any signal applied. Thus, the structure shown in FIG. 4 acts as a conventional inverter, such as a conventional complementary metal oxide semiconductor field effect transistor (CMOSFET) inverter.

While an inverter is-shown in FIG. 4, as would be known by one ordinarily skilled in the art given this disclosure, the invention is not limited to an inverter but is equally applicable to any similar integrated circuit device, such as any field effect transistor or any complimentary N-type and P-type device.

The invention is, however, distinct from such conventional complementarity semiconductor devices in that only oxide layers are formed (e.g., by epitaxial methods) and diffusion regions are avoided. Therefore, the structures which limit the size reduction of semiconductor devices, such as the doped diffusion regions, are avoided with the invention. Thus, the invention can be scaled to much smaller dimensions than similar semiconductor structures.

FIGS. 5–9 illustrates a second embodiment of the invention which forms complementary (e.g., P-type and the N-type) channel regions adjacent to each other. More specifically, the second embodiment involves growing the complementary La2CuO4 (p type) and Nd2CuO4 (n type) materials side by side on a substrate (e.g., strontium titanate substrate). With the invention, both N-type and P-type devices can be easily fabricated for low power complementary circuits, such as inverters, using straightforward lithographic techniques known to those ordinarily skilled in the art.

FIGS. 5–9 also illustrate a method of fabricating complementary materials in a planar configuration. The addition of source, drain, and gate electrodes using lithography, vias, and metallization is well-known to those ordinarily skilled in the art and are eliminated from the figures for clarity.

Figure 5:
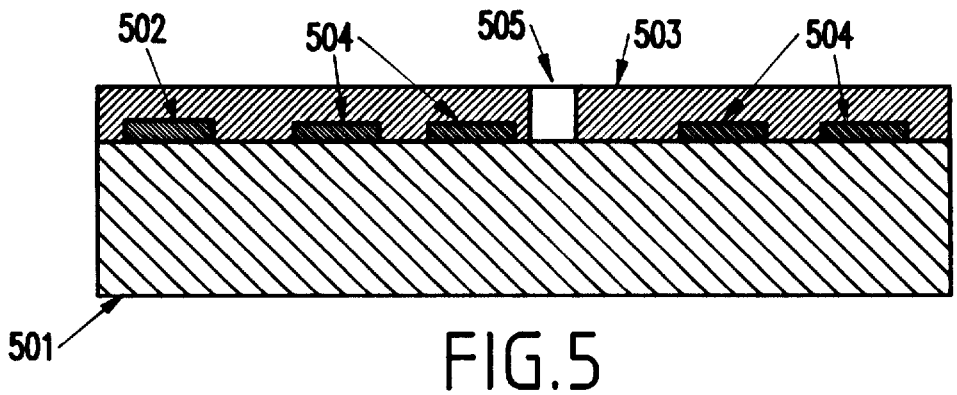
FIG. 5 is a schematic diagram of a cross-sectional view of a partially completed transistor according to a second embodiment of the invention.

Referring now to FIG. 5, an alignment mark 502 and electrodes 504 are formed on a substrate 501 in a manner similar to alignment mark 102 discussed above. Additionally, a release layer 503 (e.g., YBCO) is formed in a similar manner as discussed above. A portion of the release layer 503 and a via 505 are then lithographically masked. The exposed release layer 503 is etched using, for example, HCl or HF to form the patterned release layer 601 shown in FIG. 6.

Figure 6:
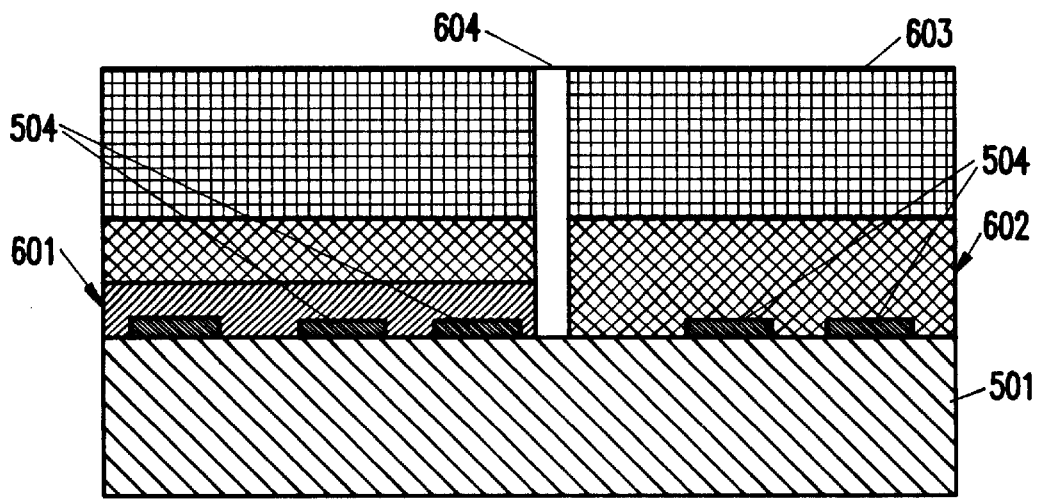
FIG. 6 is a schematic diagram of a cross-sectional view of a partially completed transistor according to a second embodiment of the invention.

A P-type Mott-transition channel layer 602 (e.g., $La_2CuO_4$) and a gate oxide layer 603 (e.g., strontium titanate) are formed over the substrate 501, again using well known techniques, such as epitaxial growing. Also, as shown in FIG. 6, a via hole 604 is made by lithographic techniques down to the substrate 501 to protect the layers 602, 603 and to facilitate the liftoff of the layers above the patterned release layer 601.

Figure 7:
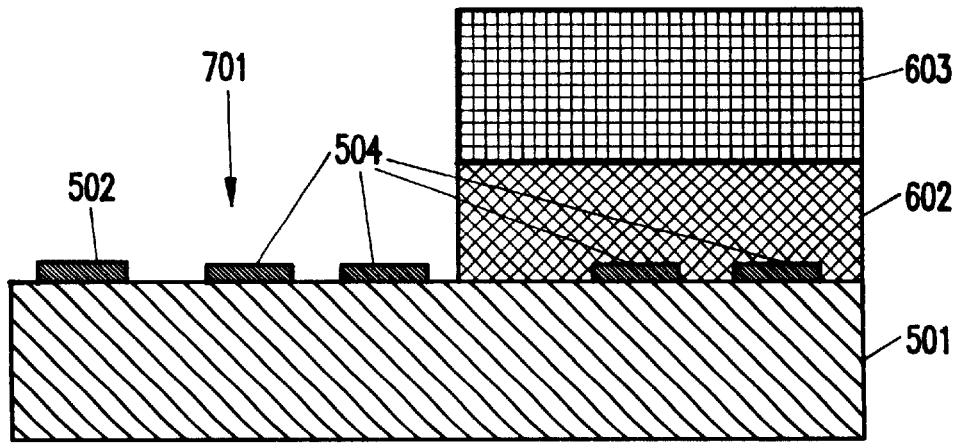
FIG. 7 is a schematic diagram of a cross-sectional view of a partially completed transistor according to a second embodiment of the invention.

FIG. 7 shows the P-type channel layer 602 and the gate oxide layer 603 remaining after the patterned release layer 601 is removed (again, for example, using an HCl or HF solution). Therefore, as shown in FIG. 7, the bare substrate region 701 is now prepared for the growth of an N-type material.

Figure 8:
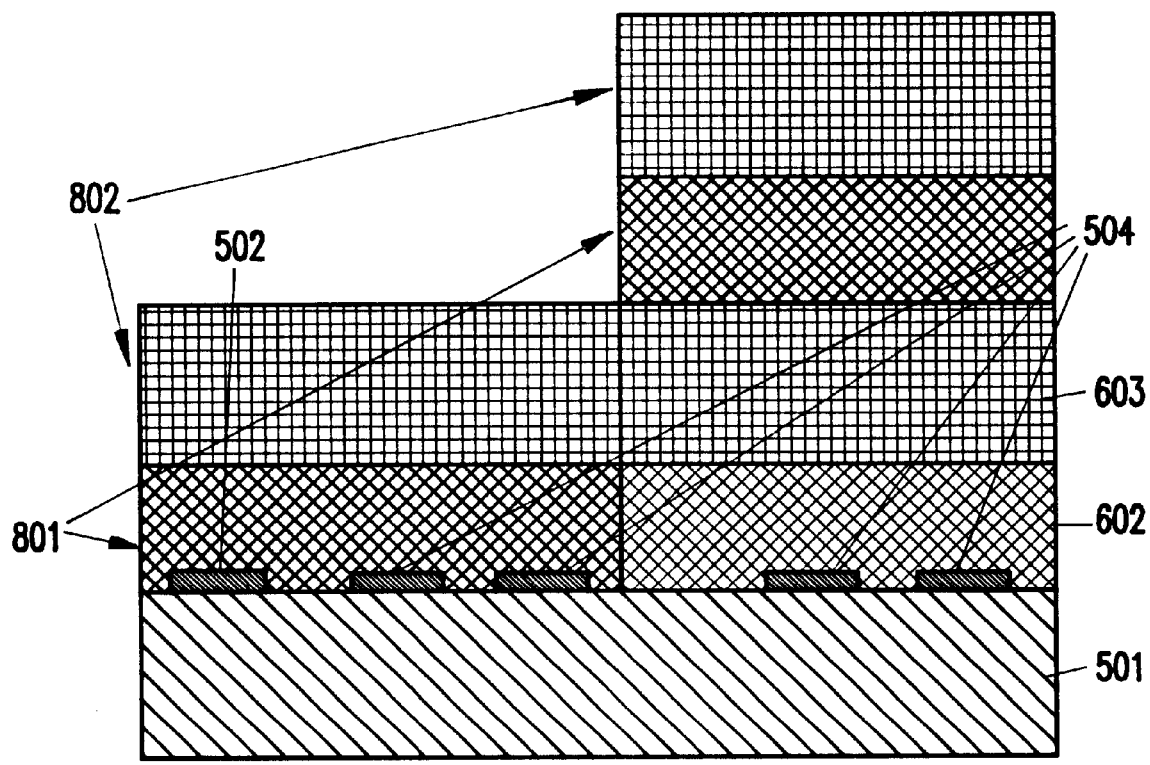
FIG. 8 is a schematic diagram of a cross-sectional view of a partially completed transistor according to a second embodiment of the invention.
Figure 9:
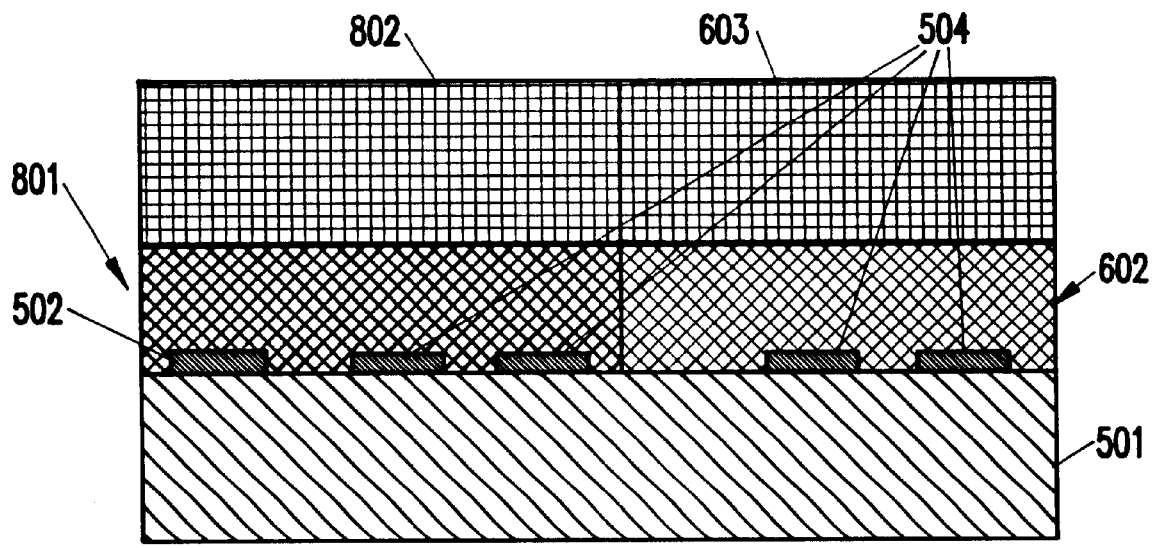
FIG. 9 is a schematic diagram of a cross-sectional view of a partially completed transistor according to a second embodiment of the invention.

Then, as shown in FIG. 8, an N-type Mott-transition channel layer 801 (e.g., $Nd_2CuO_4$) and a gate layer 802 (e.g., strontium titanate) are formed over the structure shown in FIG. 7. The excess N-type channel layer 801 and the gate layer 802 over the P-type region 602 are removed using well known techniques, such as dry or wet etching through a lithographically defined mask or chemical-mechanical polishing to leave side by side complementary N-type 801 and P-type. 602 Mott FET channel materials, as shown in FIG. 9.

Figure 10:
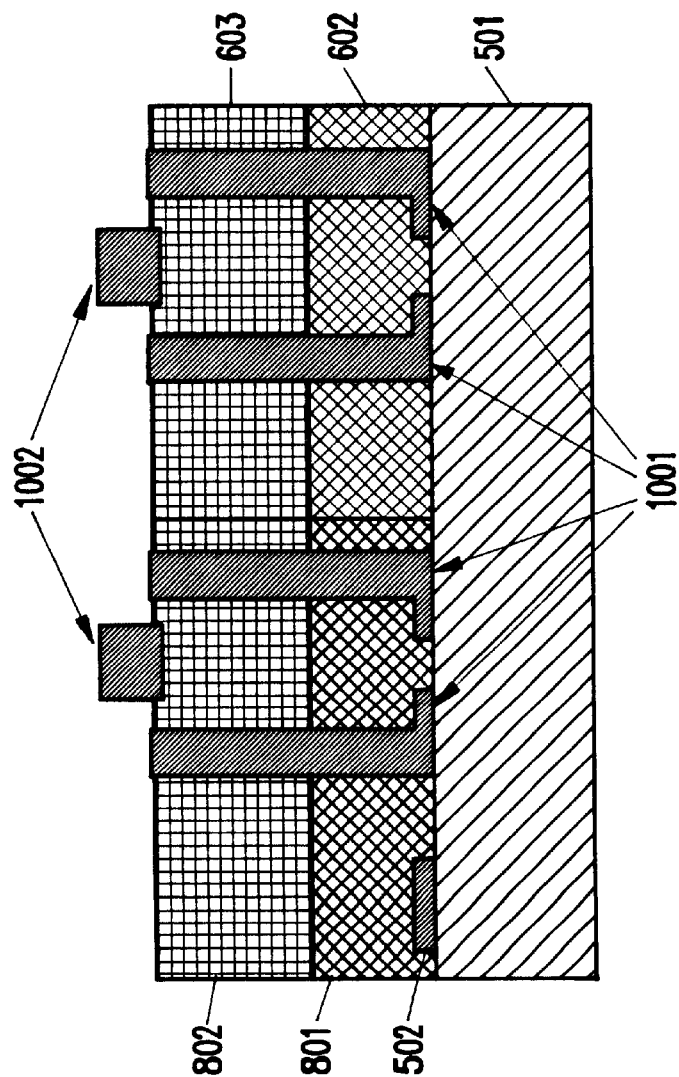
FIG. 10 is a schematic diagram of a cross-sectional view of a completed transistor according to a second embodiment of the invention.

FIG. 10 illustrates the vias 1001 opened and filled with Pt for source and drain contacts using common masking etching and deposition techniques well known to those skilled in the art. Also illustrated are the gate electrodes 1002.

Figure 11:
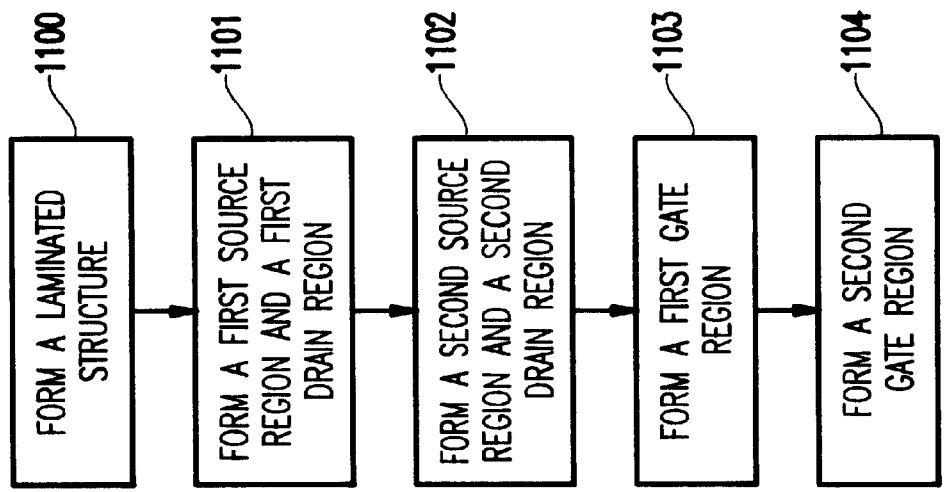
FIG. 11 is a flow diagram illustrating a preferred method of the invention.

FIG. 11 illustrates a flow diagram of the first embodiment of the invention. As shown in item 1100, a laminated structure is formed having a first side and a second side. The first side includes the first type Mott channel layer 107 and the second side includes the second type Mott channel layer 106. The first source region 408 and the first drain region 409 are formed, as shown in item 1101, on the first side. Item 1102 illustrates the second source region 302 and the second drain region 303 formed on the second side. The first gate region 301 is formed on the second side, opposite the first source region 408 and the first drain region 409 as shown in item 1103. As shown in item 1104, the second gate region 412 is formed on the first side, opposite the second source region 302 and the second drain region 303.

Figure 12:
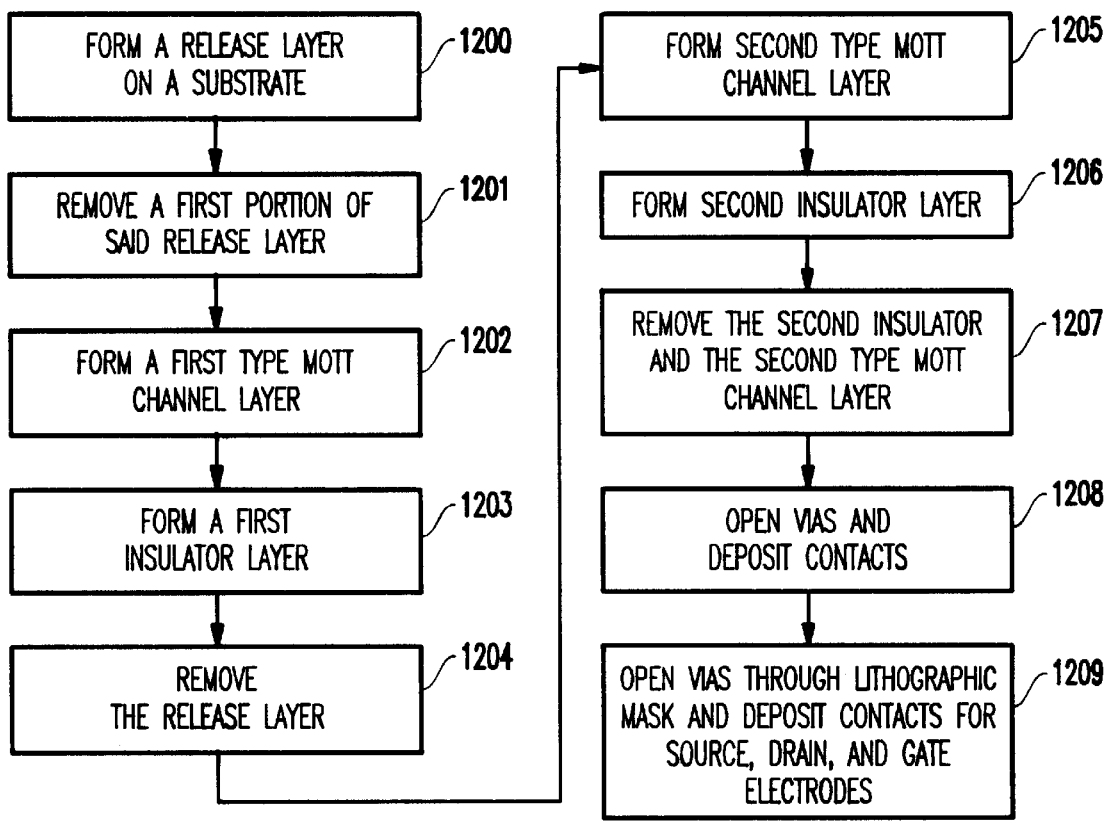
FIG. 12 is a flow diagram illustrating a preferred method of the invention.
Figure 13:
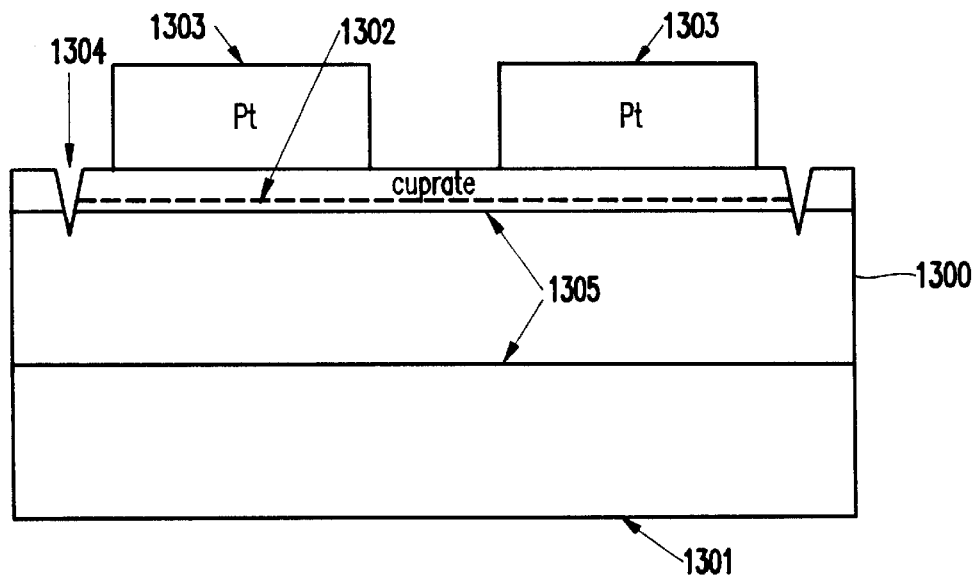
FIG. 13 is a schematic diagram of a conventional Mott FET device.

FIG. 12 illustrates a flow diagram of the second embodiment of the invention. As shown in item 1200, the release layer 503 is formed on the a substrate 501. A first portion of the release layer 503 is removed to expose a first portion of the substrate 501 and to allow a second portion of the release layer 503 to remain as shown in item 1201. In item 1202, the first type Mott channel layer 602 is formed over the first portion of the substrate 501 and the second portion of the first type Mott channel layer is formed over the second portion of the release layer 503. As shown in item 1203, the first insulator layer 603 is formed over the first portion of the first type Mott channel layer 602 and a second portion of the first insulator layer 603 is formed over the second portion of the first type Mott channel layer 602.

The second portion of the release layer 701 is removed to release the second portion of the Mott channel layer 602 as shown in item 1204 and the second portion of the first insulator layer 603 and to expose the second position of the substrate 501 as shown in item 1205. As shown in item 1206, a second type Mott channel layer 801 is formed over the first portion of the first insulator layer 603 and a second portion of the second type Mott channel layer is formed over the second portion of the substrate 501. As shown in item 1207, a first portion of a second insulator layer 802 is formed over the first portion of the second type Mott channel layer 801 and a second portion of the second insulator layer over the second portion of the second type Mott channel layer 801. As shown in item 1208, the first portion of the second insulator 802 the first portion of the second type Mott channel layer 801 are removed. As shown in item 1209, vias are opened through lithographic mask and contacts for source, drain and gate electrodes are deposited.

As would be known by one ordinarily skilled in the art given this disclosure, the foregoing structure can be formed by any number of different methods and from any number of different materials and the invention is not limited to the materials and methods described herein but is equally applicable to all equivalent processes and materials that would be known to those ordinarily skilled in the art given this disclosure.

As mentioned above, the size reduction of conventional complementary semiconductor devices is limited because it is very difficult to maintain the necessary separation between adjacent doped diffusion regions as such devices are reduced in size. Further, the Mott field effect transistor discussed in the Background section suffers from the disadvantage that the Mott channel layer may be exposed and damaged during subsequent processing. Further, the Mott FET discussed in the Background section is not used in complementary field effect transistor devices.

The invention overcomes these problems by utilizing the laminated structures shown in FIGS. 1 and 9 to create complementary metal oxide field effect transistor devices which do not include doped diffusion regions and which, therefore, can be made much smaller than conventional semiconductor devices.

While the invention has been described in terms of preferred embodiments, those skilled in the art will recognize that the invention can be practiced with modification within the spirit and scope of the appended claims.

What is claimed is:

1. A laminated complementary field effect structure comprising:
   a P-type Mott channel layer; and
   N-type Mott channel layer adjacent said P-type Mott channel layer,
   wherein said P-type Mott channel layer is complementary to said N-type Mott channel layer.

2. The structure in claim 1, further comprising:
   a first source region, a first drain region and a first gate conductor region adjacent said P-type Mott channel layer; and
   a second source region, a second drain region and a second gate conductor region adjacent said N-type Mott channel layer;
   wherein said first source region, said first drain region, said first gate conductor region and said first Mott channel layer comprise a P-type field effect transistor; and
   wherein said second source region, said second drain region, said second gate conductor region and said N-type Mott channel layer comprise a N-type field effect transistor electrically connected to said P-type field effect transistor.

3. The structure in claim 2, wherein said first source region and said first drain region comprise:
   a first conductive layer adjacent said P-type Mott channel layer; and
   a first insulator region in said first conductive layer opposite said first gate conductor,
   said first source region and said first drain region being regions in said first conductive layer on opposite sides of said first insulator region.

4. The structure in claim 3, wherein said second source region and said second drain region comprise:
   a second conductive layer adjacent said N-type Mott channel layer; and
   a second insulator region in said second conductive layer opposite said second gate conductor,
   said second source region and said second drain region being regions in said second conductive layer on opposite sides of said second insulator region.

5. The structure in claim 3, wherein said first gate conductor region and said second gate conductor region comprise:
   a gate conductor layer insulated from and positioned between said P-type Mott channel layer and said N-type Mott channel layer, said first conductive layer and said second conductive layer respectively being on opposite sides of said P-type Mott channel layer and said N-type Mott channel layer from said gate conductor layer; and
   a plurality of insulator regions in said gate conductor layer,
   wherein said first gate conductor region is a region of said gate conductor layer between two of said insulator regions and is positioned opposite and between said first source region and said first drain region; and
   wherein said second gate conductor region is a region of said gate conductor layer between two of said insulator regions and is positioned opposite and between said second source region and said second drain region.

6. The structure in claim 5, wherein said first conductive layer, said second conductive layer and said gate conductor layer comprise conductive oxide layers, and said P-type Mott transition layer is positioned on said first conductive layer; said structure further comprising:
   a first gate insulator layer positioned on said P-type Mott channel layer, said gate conductor layer being positioned on said first gate insulator layer;
   a second gate insulator layer positioned on said gate conductor layer, said N-type Mott channel layer being positioned on said second gate insulator layer, and said second conductive layer being positioned on said N-type Mott channel layer.

7. The structure in claim 1, wherein said P-type Mott channel layer and said N-type Mott channel layer change conductivity in the presence of an electric field.

8. The structure in claim 2, wherein said P-type field effect transistor and said N-type field effect transistor are connected to form said complementary field effect transistor.

9. A complementary field effect transistor structure comprising:
   a laminated structure having a first side and a second side, said first side including a P-type Mott channel layer and said second side including a N-type Mott channel layer;
   a first conductive layer on said first side having a first source region and a first drain region;

a second conductive layer on said second side having a second source region and a second drain region; and a gate conductor layer positioned between and insulated from said P-type Mott channel layer and said N-type Mott channel layer, said gate conductor layer having a first gate conductor region and a second gate conductor region, wherein said first source region, said first drain region, said first gate conductor region and said P-type Mott channel layer comprise a P-type field effect transistor and said second source region, said second drain region, said second gate conductor region and said N-type Mott channel layer comprise a N-type field effect transistor.

10. The structure in claim 9, wherein said first source region and said first drain region comprise:

a first conductive layer adjacent said P-type Mott channel layer; and a first insulator region in said first conductive layer opposite said first gate conductor, said first source region and said first drain region being regions in said first conductive layer on opposite sides of said first insulator region.

11. The structure in claim 10, wherein said second source region and said second drain region comprise:

a second conductive layer adjacent said N-type Mott channel layer; and a second insulator region in said second conductive layer opposite said second gate conductor, said second source region and said second drain region being regions in said second conductive layer on opposite sides of said second insulator region.

12. The structure in claim 11, wherein said first gate conductor region and said second gate conductor region comprise:

a gate conductor layer insulated from and positioned between said P-type Mott channel layer and said N-type Mott channel layer, said first conductive layer and said second conductive layer respectively being on opposite sides of said P-type Mott channel layer and said N-type Mott channel layer from said gate conductor layer; and a plurality of insulator regions in said gate conductor layer, wherein said first gate conductor region is a region of said gate conductor layer between two of said insulator regions and is positioned opposite and between said first source region and said first drain region; and wherein said second gate conductor region is a region of said gate conductor layer between two of said insulator regions and is positioned opposite and between said second source region and said second drain region.

13. The structure in claim 12, wherein said first conductive layer, said second conductive layer and said gate conductor layer comprise conductive oxide layers, and said P-type Mott transition layer is positioned on said first conductive layer; said structure further comprising:

a first gate insulator layer positioned on said P-type Mott channel layer, said gate conductor layer being positioned on said first gate insulator layer;

a second gate insulator layer positioned on said gate conductor layer, said N-type Mott channel layer being positioned on said second gate insulator layer, and said second conductive layer being positioned on said N-type Mott channel layer.

14. The structure in claim 9, wherein said P-type Mott channel layer and said N-type Mott channel layer change conductivity in the presence of an electric field.

15. The structure in claim 9, wherein said P-type field effect transistor and said N-type field effect transistor are connected to form said complementary field effect transistor.

16. A complementary field effect transistor structure comprising:

a substrate having first and second portions;

a P-type Mott channel layer positioned over said first portion of said substrate; and a N-type Mott channel layer positioned over said second portion of said substrate;

wherein said P-type Mott channel layer is complementary to said N-type Mott channel layer.

17. The structure in claim 16, wherein said P-type Mott channel layer and said N-type Mott channel layer change conductivity in the presence of an electric field.

18. The structure in claim 16, wherein said P-type Mott channel layer and said N-type Mott channel layer comprise complementary channel regions of a complementary field effect transistor.

19. The structure in claim 16, further comprising:

a first drain region and a first source region connected to said P-type Mott channel layer;

a first gate conductor region adjacent said P-type Mott channel layer;

a second drain region and a second source region connected to said N-type Mott channel layer; and a second gate conductor region adjacent said N-type Mott channel layer, wherein said first source region, said first drain region, said first gate conductor region and said P-type Mott channel layer comprise a P-type field effect transistor, and said second source region, said second drain region, said second gate conductor region and said N-type Mott channel layer comprise a N-type field effect transistor.

20. A laminated complementary field effect structure comprising:

a P-type Mott channel layer; and a N-type Mott channel layer laterally adjacent said P-type Mott channel layer, wherein said P-type Mott channel layer is complementary to said N-type Mott channel layer.

21. The structure in claim 20, further comprising:

a first source region, a first drain region and a first gate conductor region adjacent said P-type Mott channel layer; and a second source region, a second drain region and a second gate conductor region adjacent said N-type Mott channel layer;

wherein said first source region, said first drain region, said fir gate conductor region and said first Mott channel layer comprise a P-type field effect transistor; and wherein said second source region, said second drain region, said second gate conductor region and said N-type Mott channel layer comprise a N-type field effect transistor electrically connected to said P-type field effect transistor.

22. The structure in claim 21, wherein said first source region and said first drain region comprise:

a first conductive layer adjacent said P-type Mott channel layer; and a first insulator region in said first conductive layer opposite said first gate conductor, said first source region and said first drain region being regions in said first conductive layer on opposite sides of said first insulator region.

23. The structure in claim 22, wherein said second source region and said second drain region comprise:

a second conductive layer adjacent said N-type Mott channel layer; and a second insulator region in said second conductive layer opposite said second gate conductor, said second source region and said second drain region being regions in said second conductive layer on opposite sides of said second insulator region.

24. The structure in claim 22, wherein said first gate conductor region and said second gate conductor region comprise:

a gate conductor layer insulated from and positioned between said P-type Mott channel layer and said N-type Mott channel layer, said first conductive layer and said second conductive layer respectively being on opposite sides of said P-type Mott channel layer and said N-type Mott channel layer from said gate conductor layer; and a plurality of insulator regions in said gate conductor layer, wherein said first gate conductor region is a region of said gate conductor layer between two of said insulator regions and is positioned opposite and between said first source region and said first drain region; and wherein said second gate conductor region is a region of said gate conductor layer between two of said insulator regions and is positioned opposite and between said second source region and said second drain region.

25. The structure in claim 24, wherein said first conductive layer, said second conductive layer and said gate conductor layer comprise conductive oxide layers, and said P-type Mott transition layer is positioned on said first conductive layer, said structure further comprising:

a first gate insulator layer positioned on said P-type Mott channel layer, said gate conductor layer being positioned on said first gate insulator layer;

a second gate insulator layer positioned on said gate conductor layer, said N-type Mott channel layer being positioned on sad second gate insulator layer, and said second conductive layer being positioned on said N-type Mott channel layer.

26. The structure in claim 20, wherein said P-type Mott channel layer and said N-type Mott channel layer change conductivity in the presence of an electric field.

27. The structure in claim 21, wherein said P-type field effect transistor and said N-type field effect transistor are connected to form said complementary field effect transistor.

28. A laminated complementary field effect structure comprising:

a P-type Mott channel layer; and a N-type Mott channel layer completely over said P-type Mott channel layer, wherein said P-type Mott channel layer is complementary to said N-type Mott channel layer.

29. The structure in claim 28, further comprising:

a first source region, a first drain region and a first gate conductor region adjacent said P-type Mott channel layer; and a second source region, a second dr region and a second gate conductor region adjacent said N-type Mott channel layer;

wherein said first source region, said first drain region, said first gate conductor region and said first Mott channel layer comprise a P-type field effect transistor; and wherein said second source region, said second drain region, said second gate conductor region and said N-type Mott channel layer comprise a N-type field effect transistor electrically connected to said P-type field effect transistor.

30. The structure in claim 29, wherein said first source region and said first drain region comprise:

a first conductive layer adjacent said P-type Mott channel layer; and a first insulator region in said first conductive layer opposite said first gate conductor, said first source region and said first drain region being regions in said first conductive layer on opposite sides of said first insulator region.

31. The structure in claim 30, wherein said second source region and said second drain region comprise:

a second conductive layer adjacent said N-type Mott channel layer; and a second insulator region in said second conductive layer opposite said second gate conductor, said second source region and said second drain region being regions in said second conductive layer on opposite sides of said second insulator region.

32. The structure in claim 30, wherein said first gate conductor region and said second gate conductor region comprise:

a gate conductor layer insulated from and positioned between said P-type Mott channel layer and said N-type Mott channel layer, said first conductive layer a-ad said second conductive layer respectively being on opposite sides of said P-type Mott channel layer and said N-type Mott channel layer from said gate conductor layer; and a plurality of insulator regions in said gate conductor layer, wherein said first gate conductor region is a region of said gate conductor layer between two of said insulator regions and is positioned opposite and between said first source region and said first drain region; and wherein said second gate conductor region is a region of said gate conductor layer between two of said insulator regions and is positioned opposite and between said second source region and said second drain region.

33. The structure in claim 32, wherein said first conductive layer, said second conductive layer and said gate conductor layer comprise conductive oxide layers, and said P-type Mott transition layer is positioned on said first conductive layer; said structure further comprising:

a first gate insulator layer positioned on said P-type Mott channel layer, said gate conductor layer being positioned on said first gate insulator layer;

a second gate insulator layer positioned on said gate conductor layer, said N-type Mott channel layer being positioned on said second gate insulator layer, and said second conductive layer being positioned on said N-type Mott channel layer.

34. The structure in claim 28, wherein said P-type Mott channel layer and said N-type Mott channel layer change conductivity in the presence of an electric field.

35. The structure in claim 29, wherein said P-type field effect transistor and said N-type field effect transistor are connected to form said complementary field effect transistor.

* * * * *